United States Patent [19]

Oimura et al.

[11] Patent Number: 4,675,518

[45] Date of Patent: Jun. 23, 1987

[54] OPTICAL BISTABLE DEVICE

[75] Inventors: Katsuhiko Oimura, Osaka; Haruo Misumi; Hiroshi Ogawa, both of Joyo; Naotake Nagao, Muko, all of Japan

[73] Assignee: Omron Tateisi Electronics Co., Kyoto, Japan

[21] Appl. No.: 472,243

[22] Filed: Mar. 4, 1983

[30] Foreign Application Priority Data

Mar. 5, 1982 [JP] Japan ............................ 57-34796
Mar. 30, 1982 [JP] Japan ....................... 57-45132[U]
Apr. 16, 1982 [JP] Japan ............................ 57-63317

[51] Int. Cl.$^4$ ............................................. G01J 1/32
[52] U.S. Cl. ............................... 250/205; 372/8; 372/50; 357/19; 350/96.11; 350/96.12; 350/96.13; 350/96.14; 350/331 R; 350/332
[58] Field of Search ............... 350/96.11, 96.12, 96.13, 350/96.14, 331 R, 332, 342; 372/8, 50; 365/215; 357/19; 250/205

[56] References Cited

U.S. PATENT DOCUMENTS

| | | | |
|---|---|---|---|
| 3,610,731 | 10/1971 | Seidel ............................... | 372/8 |
| 3,813,605 | 5/1974 | Szoke ............................... | 372/8 |
| 4,021,834 | 5/1977 | Epstein et al. .................... | 350/96.12 |
| 4,136,928 | 1/1979 | Logan et al. ..................... | 350/96.11 |
| 4,297,653 | 10/1981 | Scifres et al. .................... | 372/50 |
| 4,300,211 | 11/1981 | Hudson ............................. | 365/215 |
| 4,406,513 | 9/1983 | Raphael ............................ | 350/96.16 |
| 4,422,088 | 12/1983 | Gfeller ............................. | 350/96.13 |
| 4,423,927 | 1/1984 | Bly .................................. | 350/331 R |
| 4,470,143 | 9/1984 | Kitamura et al. ................ | 372/50 |
| 4,483,004 | 11/1984 | Inaba et al. ...................... | 372/8 |
| 4,491,390 | 1/1985 | Tong-Shen ...................... | 350/331 R |
| 4,521,681 | 6/1985 | Inaba et al. ..................... | 250/205 |

OTHER PUBLICATIONS

Standley et al., *Applied Physics Letters*, vol. 25, No. 12, Dec. 15, 1974, "Nb-Diffused LiTaO$_3$ Optical Waveguides: Planar and . . . ", pp. 711-713.
Garmire, *Laser Focus*, Oct. 1975, "Moving Toward Integrated Optics", pp. 55-59.
Leonberger et al., *Applied Physics Letters*, vol. 28, No. 10, May 15, 1976, "Low-Loss GaAs p$^+$n$^-$n$^+$ Three-Dimensional Optical Waveguides", pp. 616-619.
Whinnery et al., *IEEE J. of Quantum Elec.*, vol. QE-13, No. 4, Apr. 1977, "Liquid-Crystal Waveguides for Integrated Optics", pp. 262-267.
Forbes et al., Conference: First European Conference on Integrated Optics, London, England, Sep. 14-15, 1981, "Monolithic Integration of Active and Passive Components in GaAlAs/GaAs Multilayers", pp. 83-84.

*Primary Examiner*—William L. Sikes
*Assistant Examiner*—Frank González
*Attorney, Agent, or Firm*—Cushman, Darby & Cushman

[57] ABSTRACT

A bistable optical device integrated onto a semiconductor chip with a photoresponsive element receiving an input light signal and connected electrically to a photo emitting element so that the reverse current produced in the photoresponsive element by the input light signal causes light emission which is incident upon the photoresponsive element to increase reverse current by positive feedback, resulting in change from a low to high light output at a first change value of input light and a high to low output at a second and lower change value. A light modulator is formed between the elements to receive an input light signal and vary the amount of light received by the photoresponsive element from the photo emitting device and hence the change values.

13 Claims, 12 Drawing Figures

OPTICAL BISTABLE DEVICE

BACKGROUND AND SUMMARY OF THE INVENTION

The present invention relates to an optical bistable device on a single semiconductor chip.

FIG. 1 shows a typical construction of a conventional optical bistable device, and FIG. 2 shows its equivalent circuit. This type of device is integrated and formed with a photodiode PD of double heteroconstruction and a laser diode LD placed face-to-face on a semiconductor substrate 1 separated by a groove 2. The layers of the photodiode PD and laser diode LD are composed, for instance, as follows:

1 - N+type GaAs substrate
3 - N+type GaAlAs layer
4 - P+type GaAs layer
5 - P+type GaAlAs layer
6 - P+type GaAs layer.

A common cathode electrode 7 is formed on the rear side of substrate 1 and anode electrodes 8 and 9 on the uppermost layers, respectively, of the photodiode PD and the laser diode LD. Output light is emitted from the laser diode LD at both end sides and part of the output light received by photodiode PD passing through groove 2.

In the above construction, the positive pole of a suitable DC power source is connected to the anode electrode 9 of laser diode LD, while the negative pole is connected to the electrode 8 of photodiode PD. Simultaneously, a suitable bias circuit is connected to the common electrode 7. Therefore, if an input light signal Pi is received by photodiode PD, a current reverse flows in photodiode PD and this current becomes the driving current in a forward direction for the laser diode to generate an output light Po from laser diode LD. This ouptut light is received by photodiode PD to further increase the reverse current and further intensifies the output light Po by positive feedback. Therefore, the output light Po is maintained at a stable level almost to a fixed value.

FIGS. 3 and 4 illustrate the input and output characteristics of the light emitting and receiving elements of the laser diode LD and photodiode PD. FIG. 3 is a curve showing the relation of input current to output light intensity of the laser diode LD. The output light intensity of the laser diode LD rapidly increases if the input current value exceeds a certain threshold value A. FIG. 4 is a curve showing the relation of input light intensity versus output current of the photodiode PD. The output current of the photodiode PD almost proportionately increases until reaching a value B. Once the value B is exceeded, the current stably flows at a fixed level C. FIG. 5 shows the relation between the input and output of the light emitting laser diode LD and the light receiving photodiode PD. The equivalent circuit for the arrangement of FIG. 1 is shown in FIG. 6.

In FIG. 6 both diodes PD and LD are arranged so that the output light Po of the laser diode LD is incident upon photodiode PD. The voltage of a DC power source E is suitably divided by resistors R1, R2, and R3. Bias voltages are applied, respectively, to the photodiode PD in a reverse direction and to the laser diode LD in a forward direction.

Receipt of input light signal Pi by photodiode PD produces a reverse direction current flow in photodiode PD and this current is an input to the laser diode LD. When the input light Pi reaches a certain change value X1, the output light Po rapidly increases toward a high level as shown in FIG. 5. Output current of the photodiode PD flows stably at value C when the intensity of the input light exceeds a certain value B. Accordingly, the output light Po of the laser diode LD is emitted at a certain stable level Y.

If thereafter the input light Pi decreases, the output current of the photodiode PD similarly decreases. However, the output light Po of the laser diode Ld being partially fed back to the photodiode PD, the output current decreases at a smaller gradient as shown in FIG. 5. When the input light signal falls below change value X2, the intensity of the output light Po of the laser diode LD changes rapidly from a high to a low level. Value X2 is lower than value X1. Therefore, the input and output characteristics display hysteresis, and, the input light Pi can be formed as a bianry code at a certain threshold value for waveform shaping of an optical output signal.

To change the values X1 and X2 of such a conventional optical bistable device, the values of resistors R1, R2 and R3 must be changed. Consequently, once the resistances have been chosen and the resistors assembled in a circuit, change or adjustment of the values X1 and X2 is extremely difficult.

The present invention relates to an improved bistable optical device in which a light modulating element is mounted on or integrated into the semiconductor chip and is responsive to a control signal to vary the light from the photo emitting element received by the photo responsive element and thereby vary as desired the values X1 and X2. An electrochemical crystal can be used for the light modulating element.

Other objects and purposes of the invention will be clear from the following detailed description of the invention.

DETAILED DESCRIPTION OF THE DRAWINGS

Figure 1:
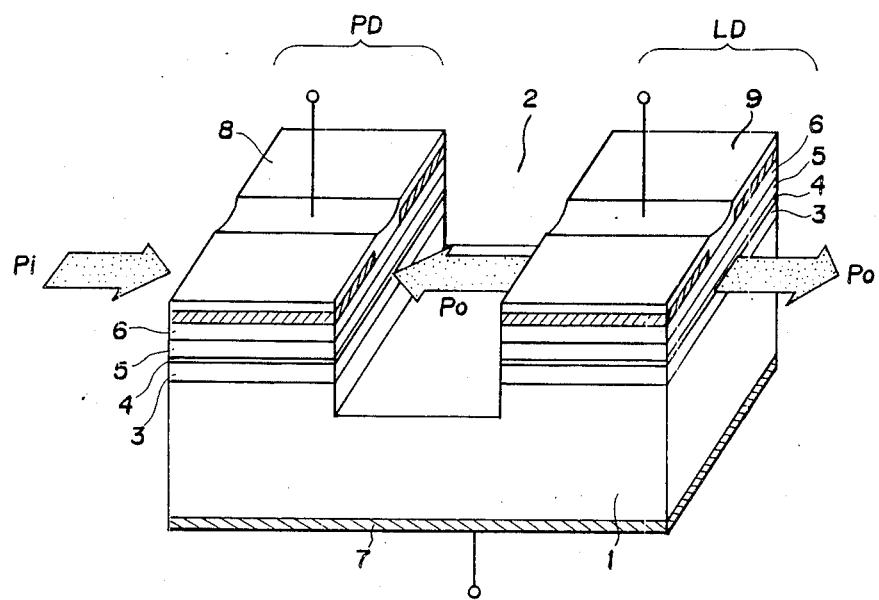
FIG. 1 is a perspective and schematic view of a conventional optical bistable device.
Figure 2:
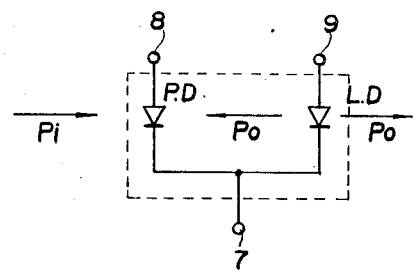
FIG. 2 is the equivalent circuit diagram of the device of FIG. 1.
Figure 3:
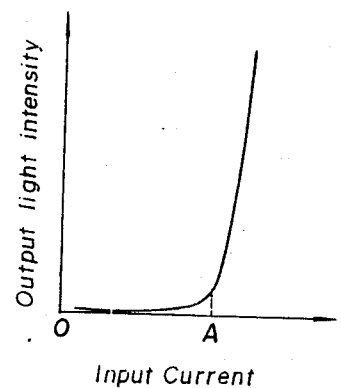
FIG. 3 shows the input and output characteristics of the laser diode.
Figure 4:
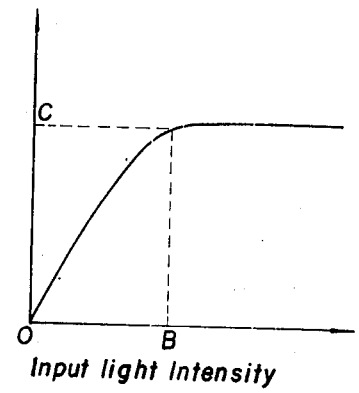
FIG. 4 shows the input and output characteristics of the photodiode.
Figure 5:
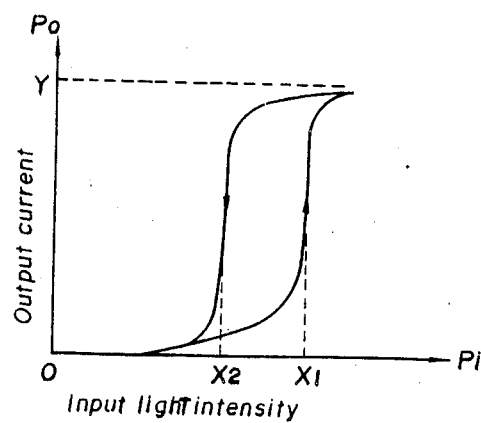
FIG. 5 shows the input and output characteristics of the optical bistable device.
Figure 7A:
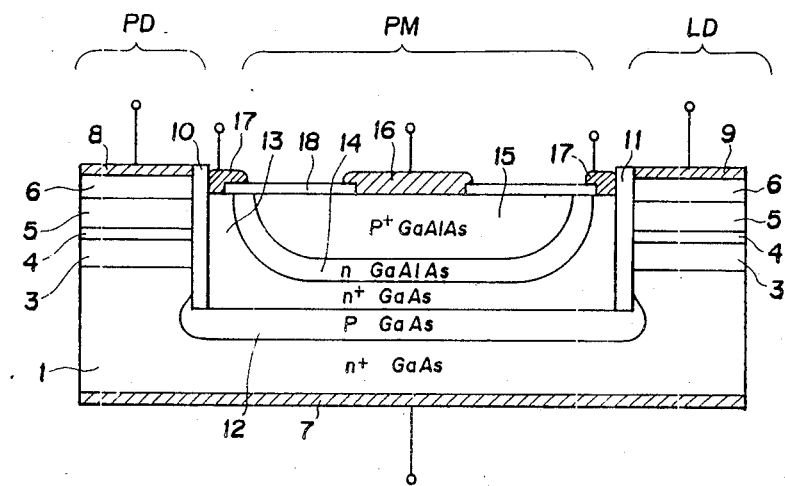
FIG. 7A is a sectional view showing a first embodiment of the present invention.
Figure 7B:
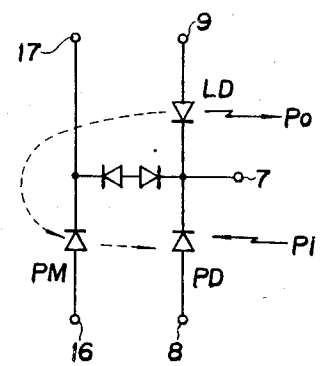
FIG. 7B shows the equivalent circuit diagram for the optical device of FIG. 7A.

Reference is now made to FIGS. 7A and 7B which illustrate a first embodiment of the present invention. This optical bistable device is formed with a light modulating element PM in groove 2 of a conventional optical bistable device as shown in FIG. 1. The photodiode PD and laser diode LD are similar to the conventional device of FIG. 1 and layers 3, 4, 5 and 6 are as described above.

An $SiO_2$ film 10 is formed on the internal side of the photodiode PD and an $SiO_2$ film 11 formed on an internal side of the laser diode LD. A layer of GaAs of P-type is formed on the bottom surface of the groove 2. Thus, light modulating element PM is insulated by films 10 and 11 and layer 12 from photodiode PD and laser diode LD.

Light modulating element PM consists of a GaAs layer 13 of N+ type, a GaAlAs layer 14 of N+ type and a GaAlAs layer 15 of P-type. An electrode 16 is formed on the central part of the GaAlAs layer 15. Electrodes 16 and 17 connect to layer 13. $SiO_2$ layer 18 overlies the light modulating element except for the areas of electrodes 16 and 17.

Figure 8:
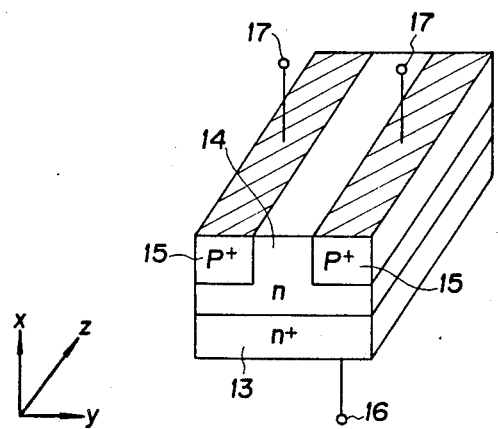
FIG. 8 shows a perspective and schematic view of a light modulating element suitable for use in the optical bistable device of the present invention.

FIG. 8 shows the construction of a light modulating element PM with layers 13, 14 and 15 and electrodes 16 and 17 as described above and shown in FIG. 7A. Light is transmitted through element PM in FIG. 8 along the direction Z. The amount of light transmitted is controlled by a DC voltage applied between electrodes 16 and 17. This light modulating element is of P-N junction construction with GaAlAs layer 15 of P+ type, GaAs layer 13 of N+ type, and GaAlAs layer 14 of N+ type. Light passing through the light modulating element in the Z direction is confined to the GaAlAs layer 14 by the difference in refractive index between the respective layers. If a reverse bias voltage is applied between GaAs layer 13 and GaAlAs layer 15, a depletion layer is formed and a non-uniform electric field generated in the upper and lower parts of layer 14. The change Δn of refractive index due to this non-uniform electric field example is well known and expressed by $$\Delta n = -(R.n^3.Ex)/2$$

where R is the electromechanical constant of GaAlAs 14 and n is the refractive index of GaAlAs. Changing the level of reverse bias voltage between electrodes 16 and 17 changes the refractive index and hence the amount of light transmitted. In FIG. 7A, light emitted from the laser diode LD is transmitted through the light modulating element PM from left to right in accordance with the level of reverse bias voltage between electrodes 16 and 17. The larger the bias voltage the less light which is transmitted.

In summary, modulating element PM operates as a waveguide to positively feedback a portion of the output light Po from laser diode LD to photodiode PD. As a result, the loop gain of the positive feedback loop can be optimally and continuously controlled by a voltage signal and change points X1 and X2 optimally adjusted by changing the applied voltage without the necessity for changing external connections.

While in the above-described embodiment a photodiode is used as the light receiving element and a laser diode as the light emitting element, the present invention is not limited to these devices. Other light receiving elements, such as a phototransistor or the like, and other light emitting elements, such as light emitting diode or like, can be used. Further, in the embodiment, the isolating layers of $SiO_2$ may be dispensed with and separation achieved by etching or the like.

Figure 6:
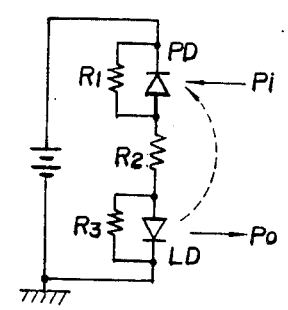
FIG. 6 is a schematic diagram showing the electrical equivalent circuit of the optical bistable device.
Figure 9:
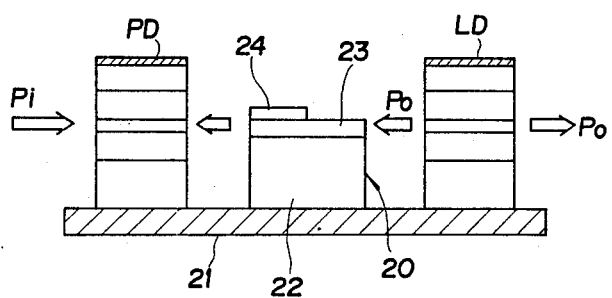
FIG. 9 shows a schematic and side view of a second embodiment of the invention.
Figure 10:
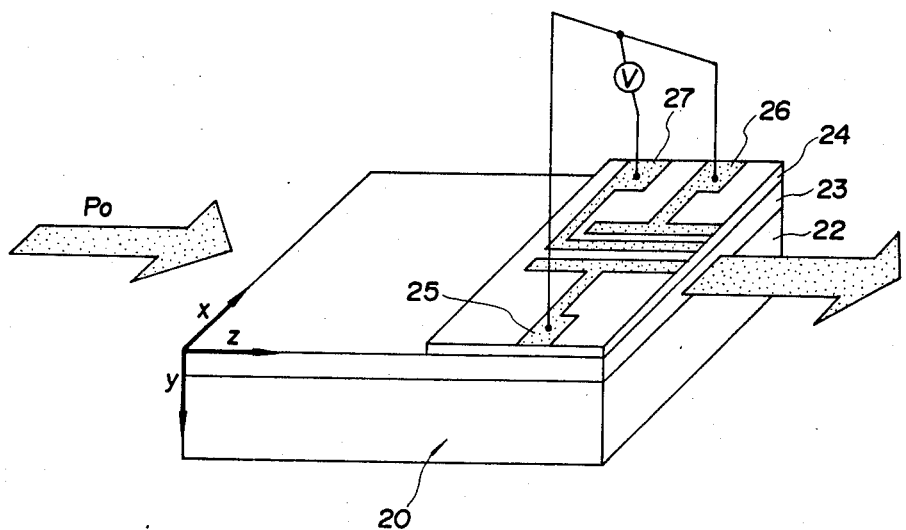
FIG. 10 shows a perspective and schematic embodiment illustrating the light modulating element of the device of FIG. 9.

Reference is now made to FIGS. 9 and 10 which illustrates a second embodiment of the present invention. This second embodiment is similar to the embodiment described above with a photodiode PD receiving an input light signal Pi, a laser diode LD emitting output light Po and a light modulating element 20 between the photodiode PD and laser diode LD. Light modulating element 20, photodiode PD and laser diode LD are mounted on a base plate 21 and electrically connected in the same manner as shown in FIG. 6.

As can be better seen in FIG. 10, light modulating element 20 is provided with an electrooptical crystal plate 22, for instance, niobium acid lithium ($LiNbO_3$) or $LiTaO_3$, an optical waveguide 23 formed by diffusing Ti on crystal plate 22 and planar-type electrodes 25, 26 and 27 formed through a buffer layer 24. Crystal plate 22 is provided with a light axis in a Y direction. Optical waveguide 23 is formed on an upper side of crystal plate 22. Further, electrodes 25, 26 and 27 are arranged transversely in the X-axis direction with electrode 27 in the center and electrodes 25 and 26, respectively, at both sides. A reverse voltage is applied to electrodes 25, 26 and 27.

The refractive index in the optical waveguide 23 under each electrode is altered by the polarity of DC voltage V to vary the amount of light propagated through the waveguide 23. The propagation loss of the positive feedback light is decreased by buffer layer 24 formed by $SiO_2$ and $Al_2O_3$ films.

If a positive voltage is applied to electrodes 26 and 26 while a negative voltage is applied to electrode 27, the refractive index directly below central electrode 27 is increased and only this portion transmits light. In consequence, the feedback light Po is not spread transversely but combined and propagated directly below the central electrode to photodiode PD.

If the polarity of DC voltage V is reversed, the refractive index immediately below electrodes 25 and 26 is increased and the positive feedback light propagated below these electrodes. As a result, the light transmitted is reduced. In this way the light modulating element 20 varies the light transmitted in accordance with the applied voltage.

Further in the above embodiment, a stripshaped metal or dielectric is provided on the upper surface of the crystal having an X-directional light axis.

Compared with the first embodiment of the invention in which the modulating element is integrated to the semiconductor chip, the electrooptical constant of the device of the second embodiment can be made larger and the device can be driven by a lower voltage.

Figure 11:
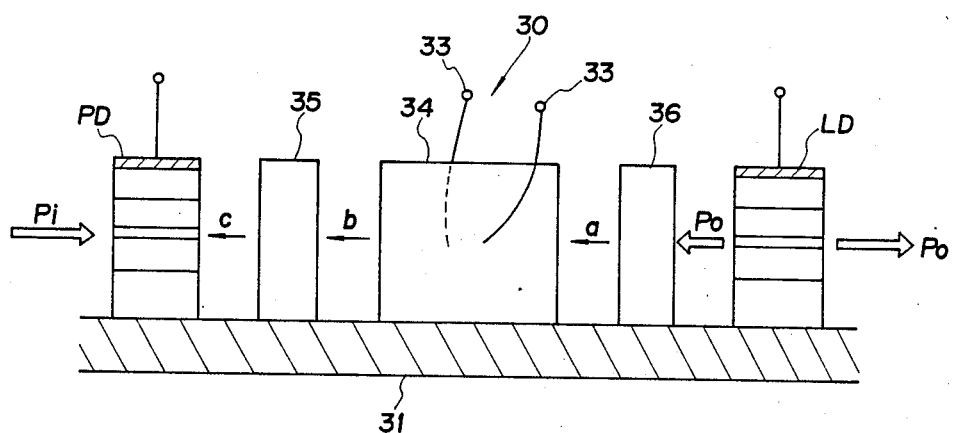
FIG. 11 shows a schematic and side view of a third embodiment of the invention.

FIG. 11 illustrates the third embodiment of the present invention. In this embodiment, the optical bistable device includes a light receiving element PD, such a photodiode, receiving an input light signal Pi, and a light emitting element LD such as a laser diode emitting an output light Po, guided from the light emitting element LD to the light receiving element PD by a light modulation device 30 on a base 31. The light modulating element 30 includes a light polarizer 36, a light deflecting plate producing a constant polarization directional component of light (linear polarization), an electrooptical crystal 34 provided with terminals 33 connected to an external power source to change the refractive index of the crystal and a light analyzer 35. As above, the crystal may be formed of niobium acid lithium or $LiTaO_3$.

The intensity of the linear polarized light from analyzer 35 is changed from zero to maximum intensity by varying the level of the applied voltage V. This, of course, varies the amount of light positively fed back from the light emitting element LD to the light receiving element PD. The use of electrooptical crystal permits use of a relatively thick light beam. The electrooptical crystal can also be used to produce elliptically polarized light from the linearly polarized light.

Further, the light modulating element can be constituted by a liquid crystal cell interposed with a spacer between a pair electrodes. The liquid crystal layer could consist of a nematic liquid crystal like APAPA, MBBA, etc. Such a crystal can be driven by a low voltage.

Many changes and modifications in the above described embodiments of the invention can of course be carried out without departing from the scope thereof. Accordingly, that scope is intended to be limited only by the scope of the appended claims.

What is claimed is:

1. A bistable optical device comprising:
   light responsive means for receiving an input light signal and having an input electrode for receiving a bias signal so that an incident light input signal produces reverse current flow;
   light emitting means having an input electrode for receiving a bias signal, said light emitting means being electrically connected to said light responsive means so that said reverse current flow causes emission of light and being positioned with respect to said light responsive means so that at least a portion of the emitted light is incident upon said light responsive means to increase said reverse current flow in positive feedback so that the intensity of the output light changes from a low to a high value at a first change point value of input light and changes from a high to a low value at a second change point value of input light less than said first value; and
   light modulating means, disposed on a chip between said light responsive means and said light emitting means having input terminals for receiving a control signal to vary the amount of light received by said light responsive element from said light emitting element and hence continuously vary said first and second change point values.

2. The optical bistable device of claim 1, in which said light modulating means comprises a GaAs layer of N+ type, a GaAlAs layer of N+ type and a GaAlAs layer of P+ type, an electrode is formed to the central part of said GaAlAs layer of P+ type, and electrodes formed to both end parts of the GaAs layer of N+ type.

3. The optical bistable device of claim 1, in which said light modulating means comprises an electrooptical crystal plate, optical waveguide, formed by diffusing Ti on said crystal plate, and planar type electrodes formed through a buffer layer.

4. The optical bistable device of claim 3, in which said electrooptical crystal plate is formed by $LiNbO_3$.

5. The optical bistable device of claim 3, using $LiTaO_3$ for said electrooptical crystal plate.

6. The optical bistable device of claim 3, in which said optical waveguide is of voltage inducing type.

7. The optical bistable device of claim 3, in which said optical waveguide is an optical waveguide of strip type.

8. The optical bistable device of claim 1 wherein said light modulating means includes a light polarizer producing constant linear polarized light from the output light, an electrooptical crystal plate having terminals adapted to be connected with an external power source to produce elliptically polarized light from said linear polarized light, and a light analyzer, producing linear polarized light inclined at a suitable angle with respect to said linear polarized light from said elliptically polarized light.

9. A bistable device as in claim 1 wherein said light responsive means is a photodiode and said light emitting means is a laser diode.

10. A bistable device as in claim 1 wherein each of said means are integrated onto a single semiconductor chip.

11. A bistable device as in claim 1 wherein said light emitting means and said light responsive means are integrated on the same chip.

12. A bistable optical device comprising:
    photoresponsive means for receiving incident light and in response thereto for producing an output current;
    photo emitting means electrically connected to said photoresponsive means for emitting an output light in response to said output current, the emitted output light being at least partially received by said photoresponsive means to increase said output current by positive feedback; and
    light modulating means for continuously varying the amount of the emitted output light from said photo emitting element received by said photoresponsive means in response to an applied input signal.

13. A bistable device as in claim 12 wherein each of said means are integrated on a semiconductor chip.

* * * * *